(12) United States Patent
Park et al.

(10) Patent No.: US 10,395,741 B2
(45) Date of Patent: Aug. 27, 2019

(54) NONVOLATILE MEMORY DEVICE

(71) Applicant: SAMSUNG ELECTRONICS CO., LTD., Suwon-si, Gyeonggi-Do (KR)

(72) Inventors: Sang-Won Park, Seoul (KR); Su-Chang Jeon, Seoul (KR); Dong-Kyo Shim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/139,921

(22) Filed: Sep. 24, 2018

(65) Prior Publication Data

US 2019/0035471 A1 Jan. 31, 2019

Related U.S. Application Data

(63) Continuation of application No. 15/484,580, filed on Apr. 11, 2017, now Pat. No. 10,102,909.

(30) Foreign Application Priority Data

Nov. 22, 2016 (KR) .................. 10-2016-0156059

(51) Int. Cl.
| | | |
|---|---|---|
| *G11C 16/10* | (2006.01) | |
| *G11C 16/04* | (2006.01) | |
| *G11C 16/08* | (2006.01) | |
| *G11C 16/26* | (2006.01) | |
| *G11C 16/34* | (2006.01) | |
| *G11C 16/24* | (2006.01) | |

(52) U.S. Cl.
CPC .......... *G11C 16/10* (2013.01); *G11C 16/0483* (2013.01); *G11C 16/08* (2013.01); *G11C 16/24* (2013.01); *G11C 16/26* (2013.01); *G11C 16/3459* (2013.01); *G11C 2211/5642* (2013.01)

(58) Field of Classification Search
CPC .................................................. G11C 16/0483
USPC .................................................. 365/185.03
See application file for complete search history.

(56) References Cited

U.S. PATENT DOCUMENTS

| | | |
|---|---|---|
| 6,480,419 B2 | 11/2002 | Lee |
| 7,298,648 B2 | 11/2007 | Lee et al. |
| 7,443,728 B2 | 10/2008 | Lee et al. |
| 7,881,120 B2 | 2/2011 | Yoshihara et al. |
| 7,986,573 B2 | 7/2011 | Li |
| 8,203,878 B2 | 6/2012 | Baek et al. |
| 8,243,496 B2 | 8/2012 | Kim |
| 8,279,221 B2 | 9/2012 | Lee |

(Continued)

FOREIGN PATENT DOCUMENTS

| | | |
|---|---|---|
| KR | 1020110078725 A | 7/2011 |
| KR | 1020120045202 A | 5/2012 |
| KR | 1020140026115 A | 3/2014 |

*Primary Examiner* — Jason Lappas
(74) *Attorney, Agent, or Firm* — Volentine, Whitt & Francos, PLLC

(57) ABSTRACT

A nonvolatile memory device includes a cell string having a plurality of memory cells connected to one bit line. A page buffer is connected to the bit line via a sensing node and connected to the cell string via the bit line. The page buffer includes a first latch for storing bit line setup information and a second latch for storing forcing information. The first latch is configured to output the bit line setup information to the sensing node, and the second latch is configured to output the forcing information to the sensing node independently of the first latch.

20 Claims, 16 Drawing Sheets

(56) References Cited

U.S. PATENT DOCUMENTS

| | | |
|---|---|---|
| 8,284,613 B2 | 10/2012 | Yamada |
| 8,743,623 B2 | 6/2014 | Cho et al. |
| 8,780,644 B2 | 7/2014 | Cho |
| 8,824,232 B2 | 9/2014 | Yoo et al. |
| 8,953,386 B2 | 2/2015 | Dutta et al. |
| 9,336,883 B2 | 5/2016 | Lee et al. |
| 2011/0292724 A1* | 12/2011 | Kim .................. G11C 16/0483 365/185.03 |

* cited by examiner

NONVOLATILE MEMORY DEVICE

CROSS-REFERENCE TO RELATED APPLICATION

This is a Continuation of U.S. application Ser. No. 15/484,580, filed Apr. 11, 2017, which claims the benefit of Korean Patent Application No. 10-2016-0156059, filed on Nov. 22, 2016, in the Korean Intellectual Property Office, the disclosure of which is incorporated herein in its entirety by reference.

BACKGROUND

The disclosure relates to a nonvolatile memory device, and more particularly, to a nonvolatile memory device including a page buffer for performing a programming operation on a memory cell.

A semiconductor memory device is a memory device implemented using semiconductors such as silicon (Si), germanium (Ge), gallium arsenide (GaAs), or indium phosphide (InP). A semiconductor memory device may be divided into a volatile memory device and a nonvolatile memory device.

A nonvolatile memory device is a memory device in which data stored in the nonvolatile memory device does not disappear even if its power supply is interrupted. Examples of a nonvolatile memory device are read-only memory (ROM), programmable ROM (PROM), erasable PROM (EPROM), electrically erasable PROM (EEPROM), a flash memory device, phase-change random-access memory (PRAM), magnetic RAM (MRAM), resistive RAM (RRAM), or ferroelectric RAM (FRAM). The flash memory device may be divided into a NOR type and a NAND type.

SUMMARY

The disclosure provides a nonvolatile memory device capable of performing a direct forcing operation without performing a dumping operation in a program execution process of the nonvolatile memory device.

According to an aspect of the disclosure, there is provided a nonvolatile memory device, which includes a cell string having a plurality of memory cells connected to a bit line, and a page buffer connected to the bit line via a sensing node and connected to the cell string via the bit line. The page buffer includes a first latch for storing bit line setup information and a second latch for storing forcing information. The first latch is configured to output the bit line setup information to the sensing node, and the second latch is configured to output the forcing information to the sensing node independently of the first latch.

According to another aspect of the disclosure, there is provided a nonvolatile memory device having a plurality of cell strings, which include a plurality of memory cells, and a page buffer with a shield bit line structure connected to the plurality of cell strings via a plurality of bit lines. The page buffer includes a first path for outputting bit line setup information to a sensing node and a second path, different from the first path, for outputting forcing information to the sensing node. The first and second paths are independently activated.

According to another aspect of the disclosure, there is provided a nonvolatile memory device having a nonvolatile memory and a page buffer circuit. The nonvolatile memory has a plurality of memory-cell strings. Each of the memory-cell strings includes a plurality of memory cells addressed by the same bit line and a different one of multiple word lines, and the memory cells of each of the memory-cell strings are addressed by a different bit line than the memory cells of every other of the plurality of memory cell strings. The page buffer circuit includes a first latch, a second latch, and a switching circuit. The switching circuit conveys first data stored by the first latch or second data stored by the second latch to a selected memory cell of the nonvolatile memory that is addressed by a selected one of the bit lines and a selected one of the word lines.

BRIEF DESCRIPTION OF THE DRAWINGS

Embodiments of the disclosure will be more clearly understood from the following detailed description taken in conjunction with the accompanying drawings in which.

DETAILED DESCRIPTION OF THE EMBODIMENTS

Figure 1:
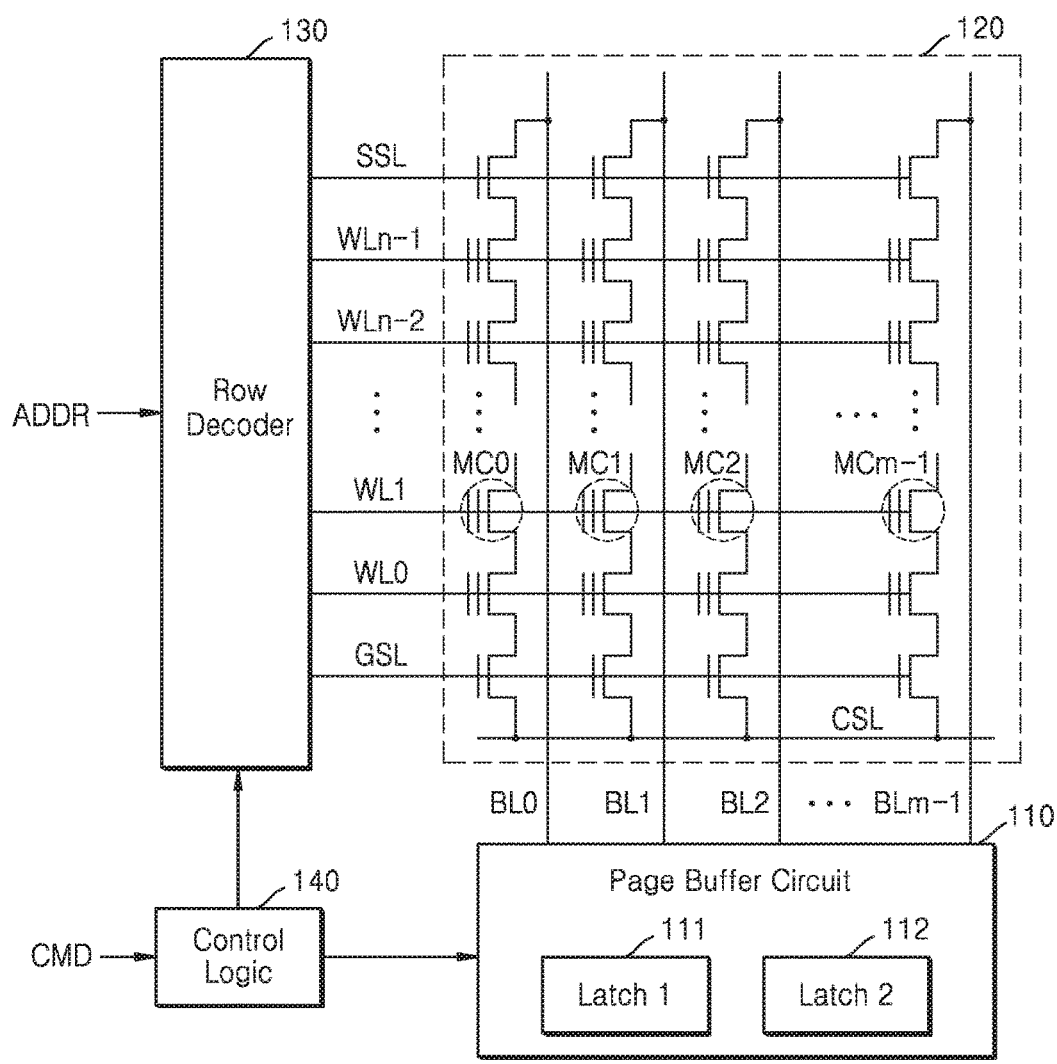
FIG. 1 is a block diagram of a nonvolatile memory device according to an example embodiment of the disclosure.

FIG. 1 is a block diagram of a nonvolatile memory device according to an example embodiment of the disclosure.

Referring to FIG. 1, a nonvolatile memory device 10 may include a page buffer circuit 110, a memory cell array 120, a row decoder 130, and a control logic 140. Although the nonvolatile memory device 10 is shown as being a flash memory device as an example, it is to be understood that the disclosure is not limited to a flash memory device, and may be applied to any type of nonvolatile memory devices (e.g., read-only memory (ROM), programmable ROM (PROM), erasable PROM (EPROM), electrically erasable PROM (EEPROM), a flash memory device, phase-change random-access memory (PRAM), magnetic RAM (MRAM), resistive RAM (RRAM), ferroelectric RAM (FRAM), etc.).

The page buffer circuit 110 may operate as a write driver or as a sense amplifier depending on an operation mode. During a programming operation, the page buffer circuit 110 may transfer a bit line voltage corresponding to data to be programmed to a bit line of the memory cell array 120. During a read operation, the page buffer circuit 110 may sense data stored in a selected memory cell through the bit line. The page buffer circuit 110 may latch the sensed data and externally output the latched data. In addition, the page buffer circuit 110 may include one or more page buffers and each of the page buffers may include a first latch 111 and a second latch 112 that include information necessary for a programming operation. According to an example embodiment of the disclosure, the first latch 111 may store information about a bit line setup operation and the second latch 112 may store information about a forcing operation. Detailed descriptions thereof will be described later below with reference to FIG. 2 or the like.

The memory cell array 120 may be connected to the row decoder 130 via word lines WL0 through WLn−1, a cell string selecting line SSL, and a ground selecting line GSL. The memory cell array 120 may be connected to the page buffer circuit 110 via bit lines BL0 through BLm−1. The memory cell array 120 may include a plurality of NAND cell strings. Each of the NAND cell strings may be connected to a bit line via a cell string selecting transistor SST. The memory cell array 120 may be formed of planes including a plurality of memory blocks, and the plurality of memory blocks may include a plurality of pages. The plurality of pages may include a plurality of memory cells. And each page may include a plurality of memory cells MC0 through MCm−1.

According to an embodiment of the disclosure, a two-dimensional (2D) memory array or a three-dimensional (3D) memory array is provided. The 3D memory array is monolithically formed on an active region disposed over a silicon substrate and at least one physical level of memory cell arrays having circuits formed on or in the silicon substrate as circuits related to an operation of memory cells. The term "monolithically" indicates that layers of each level forming the 3D memory array are stacked directly on layers of each lower level of the 3D memory array.

According to an example embodiment of the disclosure, the 3D memory array includes vertical NAND cell strings arranged in a vertical direction such that at least one memory cell is located above another memory cell. The at least one memory cell may include a charge trap layer.

U.S. Pat. Nos. 7,679,133, 8,553,466, 8,654,587, 8,559,235, and U.S. Patent Application Publication No. 2011-0233648 are incorporated herein by reference in their entirety as describing suitable configurations for a 3D memory array including multiple levels and in which word lines and/or bit lines are shared between the levels. The memory cell array 120 will be described in detail with reference to FIGS. 3 through 5.

The row decoder 130 may select any one of the memory blocks of the memory cell array 120 in response to an address ADDR. The row decoder 130 may select any one of the word lines of the selected memory block. The row decoder 130 may transfer a word line voltage from a voltage generator (not shown) to the word line of the selected memory block.

The control logic 140 may receive a programming command CMD and may output various control signals for controlling the page buffer circuit 110 and the row decoder 130 to perform a programming operation in response to the programming command CMD.

Figure 2:
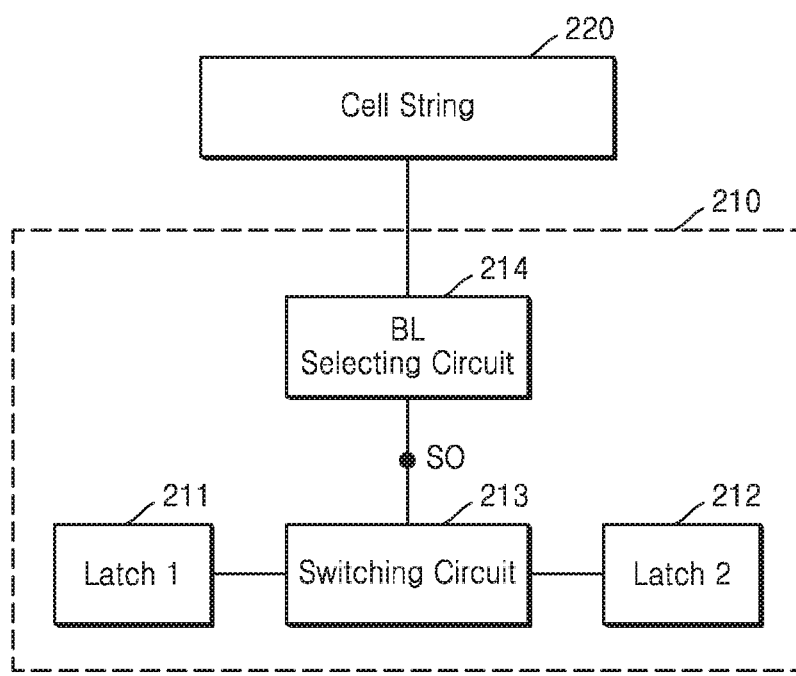
FIG. 2 is a block diagram of a nonvolatile memory device according to an example embodiment of the disclosure.

FIG. 2 is a block diagram of a nonvolatile memory device according to an example embodiment of the disclosure. In FIG. 2, like reference numerals to those in FIG. 1 denote like elements, and therefore, repeated descriptions thereof will not be given herein.

Referring to FIGS. 1 and 2, a nonvolatile memory device 20 may include a page buffer 210 and a cell string 220. The page buffer 210 may include a first latch 211, a second latch 212, a switching circuit 213, and a bit line selecting circuit 214. In addition, the cell string 220 may be substantially the same as a cell string in the memory cell array 120 of FIG. 1, which will be described later below with reference to FIG. 3.

The first latch 211 may store information about a bit line setup operation during a programming operation. In more detail, the first latch 211 may include distinct information for distinguishing, from each other, a cell to be programmed and a cell to be inhibited. During the bit line setup operation, the page buffer 210 may apply different voltages to the cell to be programmed and the cell to be inhibited by using the programming/inhibiting distinct information that is applied to a sensing node SO by the first latch 211.

The second latch 212 may store information about a forcing operation during a programming operation. In more detail, the second latch 212 may include distinct information for distinguishing, from each other, a cell to be forced and a cell not to be forced. During the forcing operation, the page buffer 210 may apply different voltages to the cell to be forced and the cell not to be forced by using the forcing distinct information stored in the second latch 212. In an example embodiment of the disclosure, the second latch 212 may directly apply the forcing distinct information to the sensing node SO under the control of the switching circuit 213 without a dumping operation for the first latch 211, in which the second latch 212 dumps the forcing information to the first latch 211 during the forcing operation. Accordingly, when the page buffer 210 performs a forcing operation during a programming operation for the cell string 220, the forcing operation may be performed without the dumping operation for the first latch 211, so that the program performance may be improved.

The switching circuit 213 may control a connection between the sensing node SO and the first and second latches 211 and 212. In more detail, the switching circuit 213 may connect the first latch 211 to the sensing node SO in the bit line setup operation and may connect the second latch 212 to the sensing node SO in the forcing operation. Accordingly, the second latch 212 including forcing information may be directly connected to the sensing node SO to apply the forcing information without performing the dumping operation for the first latch 211 through the switching circuit 213, and the page buffer 210 may perform a forcing operation on the cell string 220 using the forcing information. To this end, the switching circuit 213 may include one or more switching devices for performing a switching operation.

The bit line selecting circuit 214 may control a connection between a bit line and the sensing node SO. To this end, the bit line selecting circuit 214 may include one or more switching devices for performing a switching operation. The bit line selection circuit 214 may apply, to the cell string 220, the programming/inhibiting distinct information or the forcing information that is applied to the sensing node SO by the first latch 211 or the second latch 212. Detailed descriptions thereof will be described later below with reference to FIG. 10.

Figure 3:
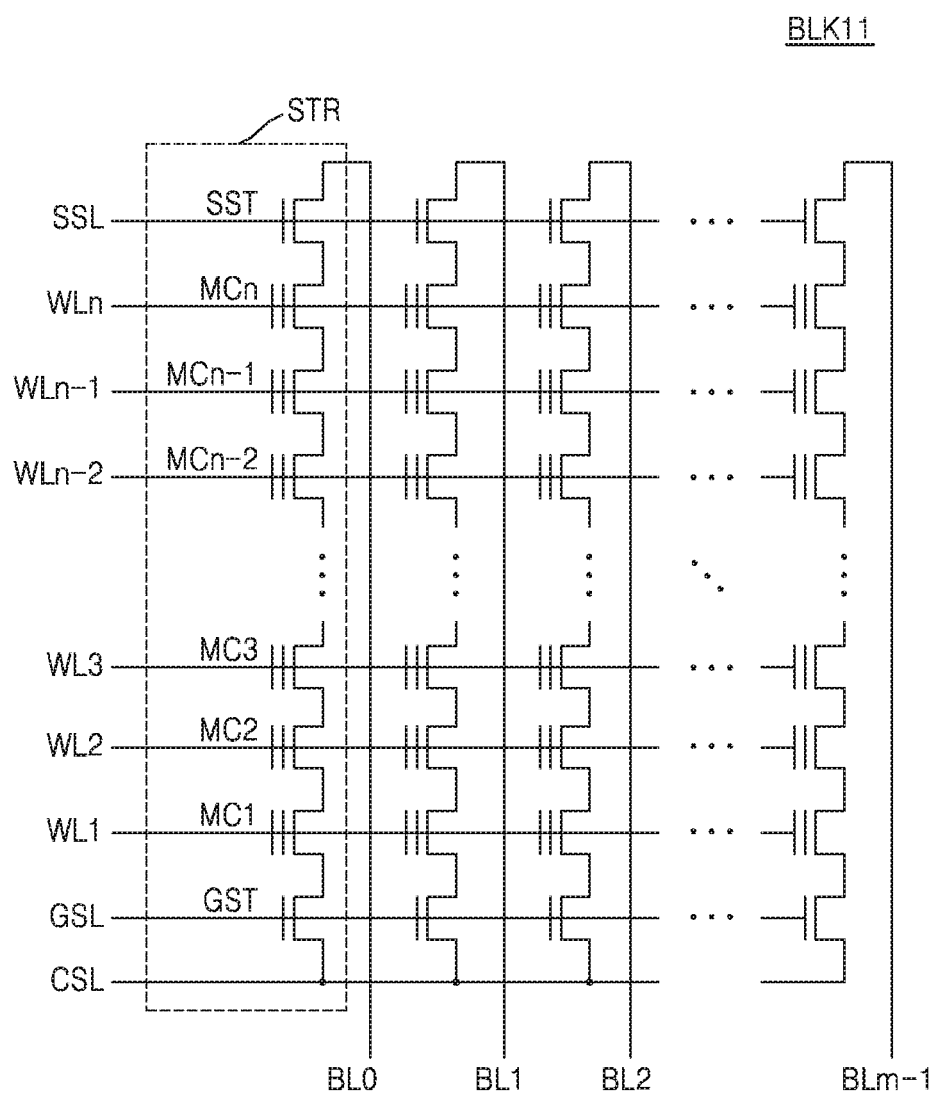
FIG. 3 is a circuit diagram of a memory block according to an example embodiment of the disclosure.

FIG. 3 is a circuit diagram of a memory block according to an example embodiment of the disclosure.

Referring to FIG. 3, for example, the memory cell array 120 (of FIG. 1) may be a memory cell array of a horizontal NAND flash memory, and may include a plurality of memory blocks. Each memory block BLK11 may include n (n is an integer of 2 or more) cell strings STRs in which a plurality of memory cells MC (e.g., MC1 through MCn) are connected in series in a direction of bit lines BL0 through BLm−1. FIG. 3 shows an example in which each cell string STR includes eight memory cells.

A NAND flash memory device having the structure shown in FIG. 3 is erased on a block basis and executes a program in page units corresponding to each of the word lines WL0 through WLn. FIG. 3 shows an example in which n pages for n word lines WL1 through WLn are provided in one block. In addition, the nonvolatile memory device 10 of FIG. 1 may include a plurality of memory cell arrays that perform the same operation with the same structure as the memory cell array 120 described above.

Figure 4:
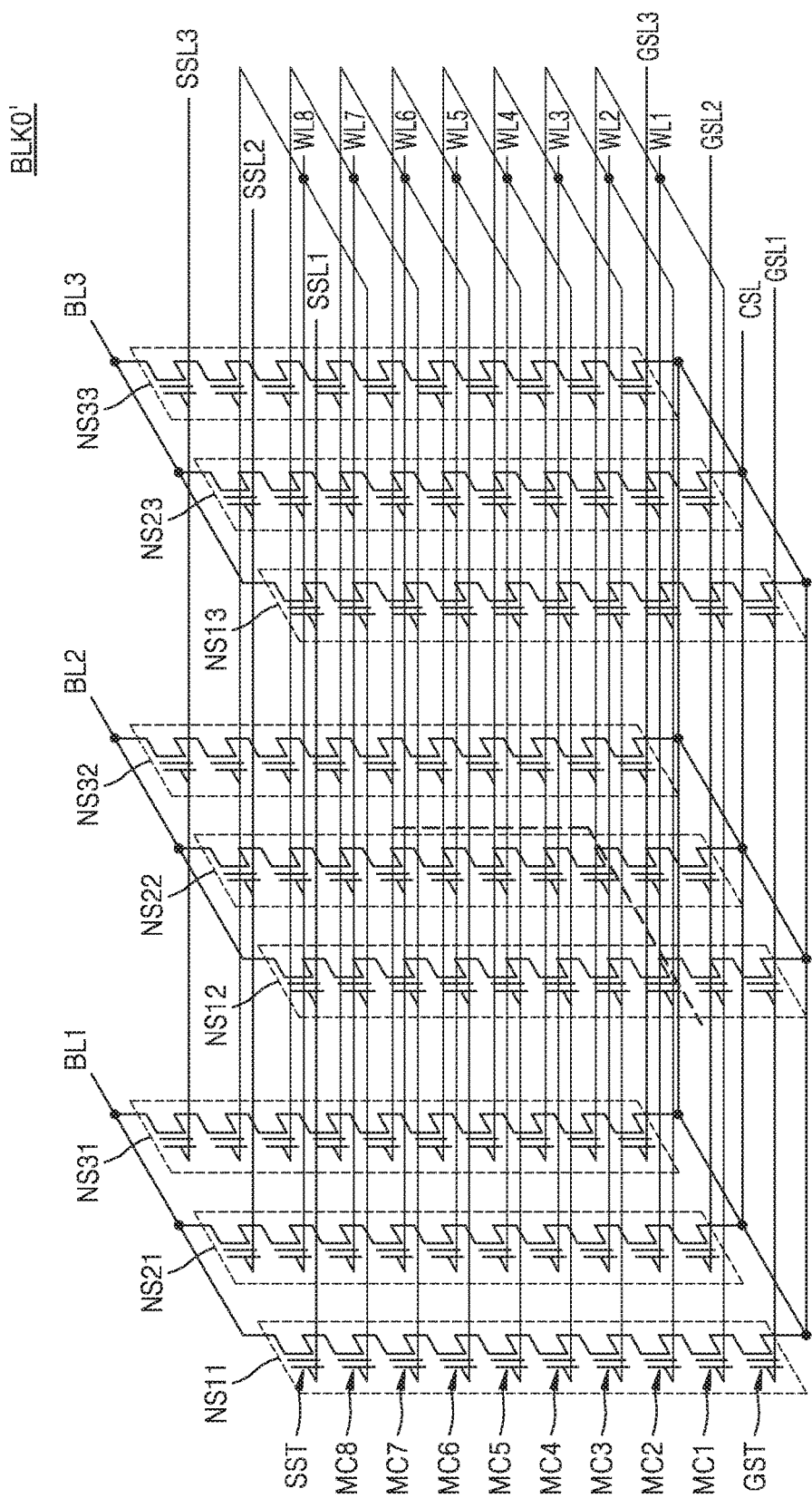
FIG. 4 is a circuit diagram of another example of a memory block BLK0' included in a memory cell array according to an example embodiment of the disclosure.

FIG. 4 is a circuit diagram of another example of a memory block BLK0' included in a memory cell array according to an example embodiment of the disclosure.

Referring to FIG. 4, for example, the memory cell array 120 (of FIG. 1) may be a memory cell array of a vertical NAND flash memory, and may include a plurality of memory blocks. Each memory block BLK0' may include a plurality of NAND cell strings NS11 through NS33, a plurality of word lines WL1 through WL8, a plurality of bit lines BL1 through BL3, a plurality of ground selecting lines GSL1 through GSL3, a plurality of cell string selecting lines SSL1 through SSL3, and a common source line CSL. The number of NAND cell strings, the number of word lines, the number of bit lines, the number of ground selecting lines, and the number of cell string selecting lines may be variously changed according to an example embodiment.

The NAND cell strings NS11, NS21 and NS31 are provided between the first bit line BL1 and the common source line CSL, the NAND cell strings NS12, NS22 and NS32 are provided between the second bit line BL2 and the common source line CSL, and the NAND cell strings NS13, NS23 and NS33 are provided between the third bit line BL3 and the common source line CSL. Each NAND cell string (e.g., NS11) may include the cell string selecting transistor SST, a plurality of memory cells MC1 through MC8, and a ground selecting transistor GST that are connected in series.

Cell strings connected in common to one bit line form one column. For example, the cell strings NS11, NS21 and NS31 connected in common to the first bit line BL1 may correspond to a first column, the cell strings NS12, NS22 and NS32 connected in common to the second bit line BL2 may correspond to a second column, and the cell strings NS13, NS23, NS33 connected in common to the third bit line BL3 may correspond to a third column.

Cell strings connected to one string selecting line form one row. For example, the cell strings NS11, NS12, and NS13 connected to the first cell string selecting line SSL1 may correspond to a first row, the cell strings NS21, NS22 and NS23 connected to the second cell string selecting line SSL2 may correspond to a second row, and the cell strings NS31, NS32, NS33 connected to the third cell string selecting line SSL3 may correspond to a third row.

The cell string selecting transistor SST is connected to a corresponding string selecting line among the string selecting lines SSL1 through SSL3. The plurality of memory cells MC1 through MC8 are connected to the corresponding word lines WL1 to WL8, respectively. The ground selecting transistor GST is connected to a corresponding ground selecting line among the ground selecting lines GSL1 through GSL3. The cell string selecting transistor SST is connected to a corresponding bit line among the bit lines BL1 through BL3, and the ground selecting transistor GST is connected to the common source line CSL.

Word lines (e.g., WL1) having the same height are commonly connected to each other. The cell string selecting lines SSL1 through SSL3 are separated from each other, and the ground selecting lines GSL1 through GSL3 are also separated from each other. For example, when memory cells connected to the first word line WL1 and belonging to the cell strings NS11, NS12, and NS13 are programmed, the first word line WL1 and the first cell string selecting line SSL1 are selected. The ground selecting lines GSL1 through GSL3 may be commonly connected to each other.

Figure 5:
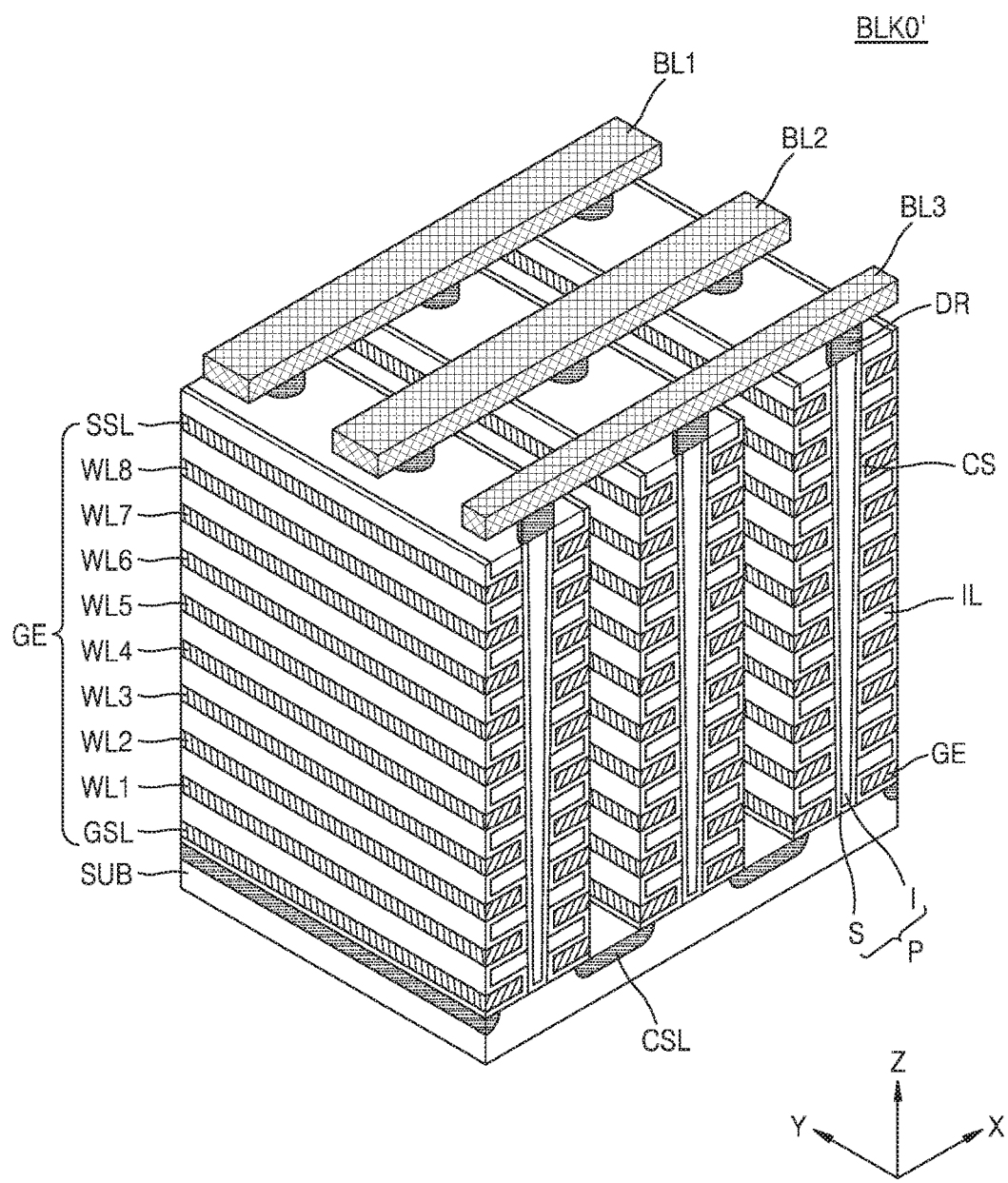
FIG. 5 is a perspective view of the memory block BLK0' of FIG. 4.

FIG. 5 is a perspective view of the memory block BLK0' of FIG. 4.

Referring to FIG. 5, each memory block included in, e.g., the memory cell array 120 (of FIG. 1), is formed in a direction perpendicular to a substrate SUB. Although FIG. 5 shows that a memory block includes two of the selecting lines GSL and SSL, eight of the word lines WL1 through WL8, and three of the bit lines BL1 through BL3, in practice it may be more or less than these.

The substrate SUB has a first conductivity type (e.g., a p-type), and a common source line CSL extending along a first direction (e.g., a Y direction) and doped with impurities of a second conductivity type (e.g., an n-type) is provided on the substrate SUB. A plurality of insulating layers IL extending along the first direction are sequentially provided along a third direction (e.g., a Z-direction) on a region of the substrate SUB between two adjacent common source lines CSL, and the plurality of insulating layers IL are spaced apart from each other by a specific distance along the third second directions. For example, the plurality of insulating layers IL may include an insulating material such as silicon oxide.

A plurality of pillars P arranged sequentially along the first direction and passing through the plurality of insulating layers IL along the third direction are provided on the region of the substrate SUB between the two adjacent common source lines CSL. For example, the plurality of pillars P may penetrate the plurality of insulating layers IL and contact the substrate SUB. In more detail, a surface layer S of each pillar P may include a first type of silicon material and may function as a channel region. An inner layer I of each pillar P may include an insulating material such as silicon oxide or an air gap.

In the region of the substrate SUB between the two adjacent common source lines CSL, a charge storage layer CS is provided along exposed surfaces of the insulating layers IL, the pillars P, and the substrate SUB. The charge storage layer CS may include a gate insulating layer (referred to as a tunneling insulating layer), a charge trap layer, and a blocking insulating layer. For example, the charge storage layer CS may have an oxide-nitride-oxide (ONO) structure. In addition, in the region between the two adjacent common source lines CSL, a gate electrode GE such as the selecting lines GSL and SSL and the word lines WL1 through WL8 is formed on an exposed surface of the charge storage layer CS.

Drains or drain contacts DR are provided on the plurality of pillars P, respectively. For example, the drains or drain contacts DR may include a silicon material doped with impurities of a second conductivity type. The bit lines BL1 through BL3 extending in a second direction (e.g., an X-direction) and spaced apart by a certain distance along the first direction are provided on the drains DR.

Figure 6:
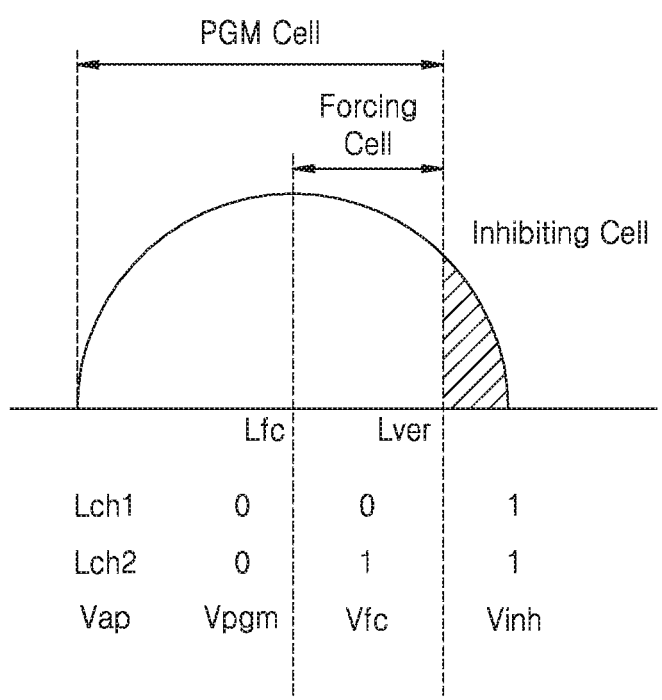
FIG. 6 is a graph illustrating a threshold voltage distribution of memory cells according to an example embodiment of the disclosure.

FIG. 6 is a graph illustrating threshold voltage distribution of memory cells according to an example embodiment of the disclosure.

Referring to FIGS. 2 and 6, the first latch 211 may store first latch information Lch1 corresponding to a verifying level Lver. In an example embodiment of the disclosure, memory cells having a threshold voltage level greater than the verifying level Lver may be inhibiting cells (Inhibiting Cell). The first latch 211 may store '1' as the first latch information Lch1. Furthermore, memory cells having a threshold voltage level less than the verifying level Lver may be programming cells (PGM Cell). The first latch 211 may store '0' as the first latch information Lch1.

The second latch 212 may include second latch information Lch2 corresponding to a forcing level Lfc as forcing information for a forcing operation. The forcing level Lfc may be less than the verifying level Lver. In an example embodiment of the disclosure, memory cells having a threshold voltage level greater than the forcing level Lfc and less than the verifying level Lver may be forcing cells (Forcing Cell). When the threshold voltage level is greater than the forcing level Lfc, the second latch 212 may store '1' as the second latch information Lch2. Furthermore, if memory cells having a threshold voltage level less than the forcing level Lfc are programming cells but not forcing cells, the second latch 212 may store '0' as the second latch information Lch2. The page buffer 210 may apply a different voltage Vap to each memory cell using the first and second latch information Lch1 and Lch2.

The page buffer 210 may perform a programming operation including a forcing operation using a two-step verification method. When the programming operation is performed with only one voltage level on the programming cells, a voltage distribution may widen. Therefore, the page buffer 210 of the disclosure may perform, based on the forcing level Lfc, a first program with a programming voltage Vpgm for cells that are not to be forced and may perform a second program with a forcing voltage Vfc for cells to be forced. In more detail, the page buffer 210 may perform a bit line forcing operation by applying the forcing voltage Vfc to cells to be forced, wherein the forcing voltage Vfc is higher than the programming voltage Vpgm and lower than an inhibiting voltage Vinh.

For example, the programming voltage Vpgm may be a ground voltage GND, the inhibiting voltage Vinh may be a power voltage VDD, and the forcing voltage Vfc may have a voltage level between the power voltage VDD and the ground voltage GND. Therefore, the page buffer 210 may distinguish a cell to be inhibited, a forcing cell, and a programming cell that is not to be forced from one another based on the first and second latch information Lch1 and Lch2. In more detail, the page buffer 210 may distinguish, from each other, a programming cell and an inhibiting cell using the first latch information Lch1 in a bit line setup operation and may distinguish, from each other, a forcing cell and a programming cell that is not to be forced using the second latch information Lch2 in a forcing operation.

Accordingly, the page buffer 210 may apply the inhibiting voltage Vinh to the cell to be inhibited, the forcing voltage Vfc to the cell to be forced, and the programming voltage Vpgm to the programming cell that is not to be forced. Hereinafter, the first latch information Lch1 is referred to as bit line setup information and the second latch information Lch2 is referred to as forcing information.

Figure 7:
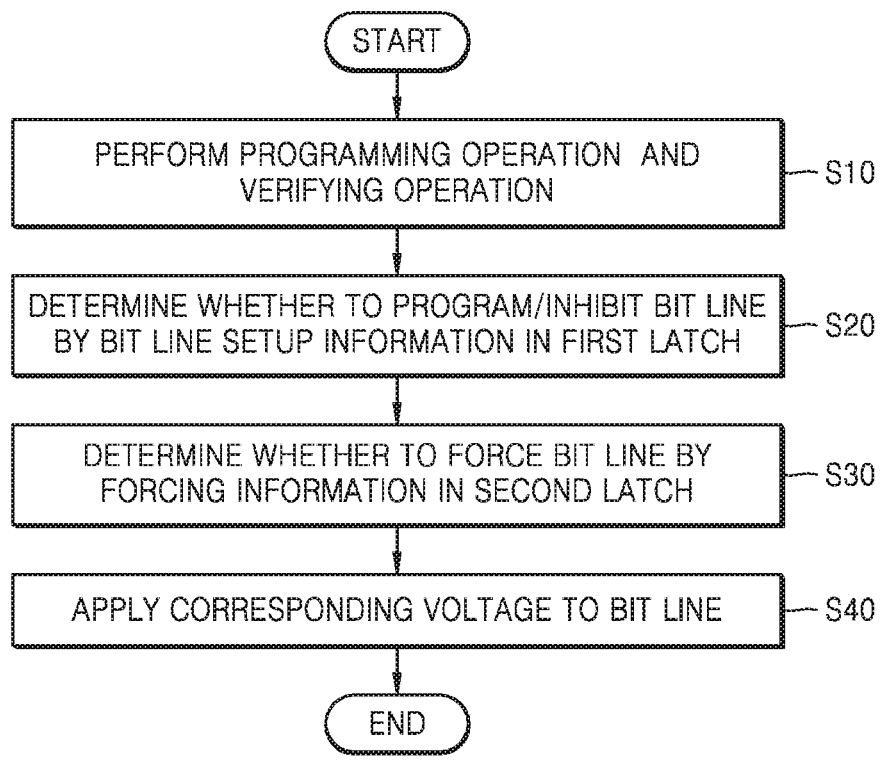
FIG. 7 is a flowchart illustrating an operation of a nonvolatile memory device according to an example embodiment of the disclosure.

FIG. 7 is a flowchart illustrating an operation of a nonvolatile memory device according to an example embodiment of the disclosure.

Referring to FIGS. 1 and 7, in operation S10, the control logic 140 may receive the programming command CMD from a host and perform a programming operation and a verifying operation. The programming operation may include an initial programming operation. The control logic 140 may output a control signal corresponding to the page buffer circuit 110 in correspondence to the programming command CMD. In operation S20, the page buffer circuit 110 may determine, using the bit line setup information stored in the first latch 111, whether to program/inhibit a bit line. In addition, in operation S30, the page buffer circuit 110 may determine, using forcing information stored in the second latch 112 whether to force a bit line. In operation S40, the page buffer circuit 110 may distinguish a forcing cell, a programming cell that is not to be forced, and an inhibiting cell from one another based on the bit line setup information and the forcing information, and may apply a corresponding voltage to the bit line.

Figure 8:
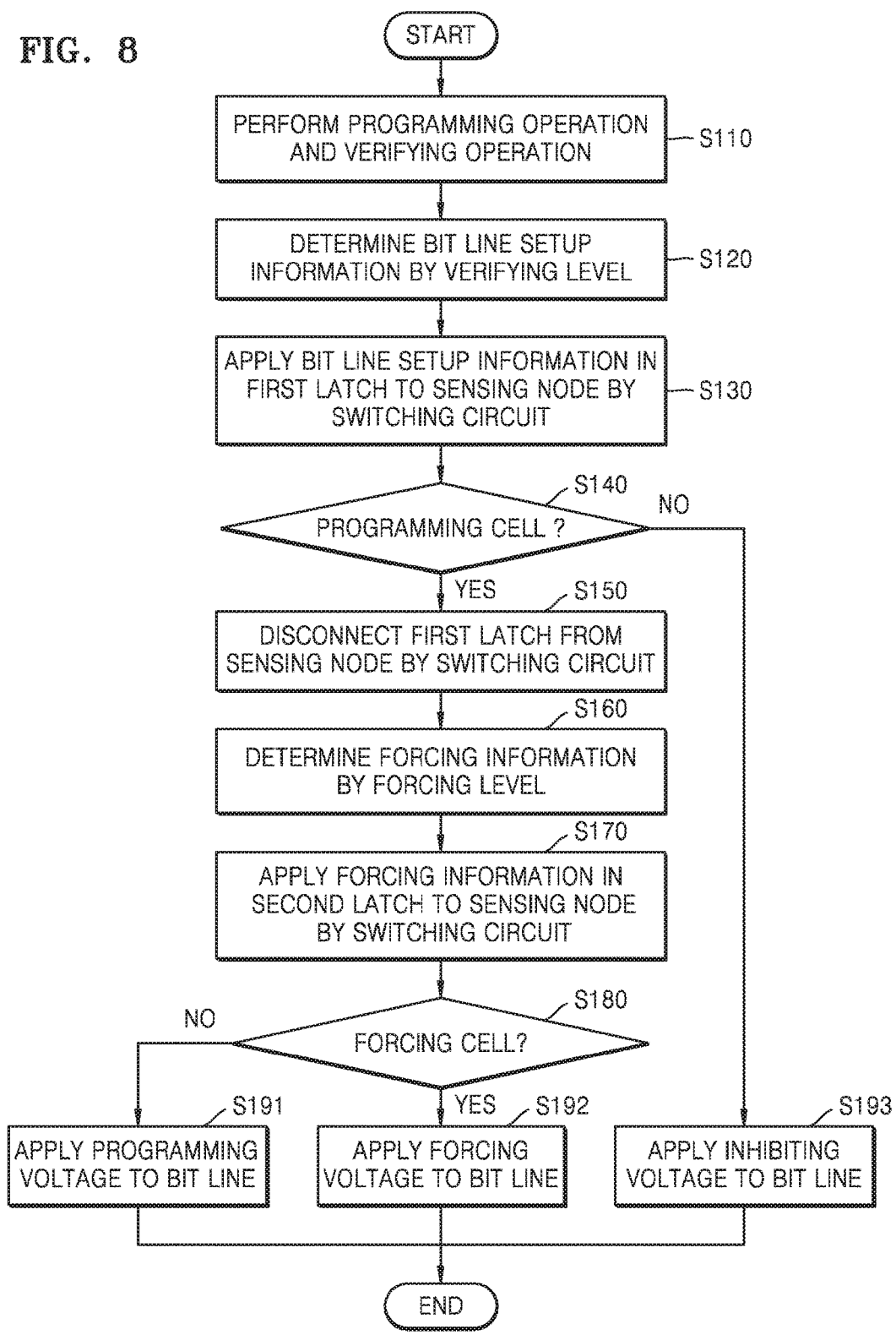
FIG. 8 is a flowchart illustrating an operation of a nonvolatile memory device according to an example embodiment of the disclosure.

FIG. 8 is a flowchart illustrating an operation of a nonvolatile memory device according to an example embodiment of the disclosure.

Referring to FIGS. 2, 6 and 8, in operation S110, the control logic 140 may receive the programming command CMD from a host and perform a programming operation and a verifying operation. The programming operation may include an initial programming operation. In operation S120, the page buffer 210 may determine bit line setup information including programming/inhibiting distinguishing information for cells using the verifying level Lver. During a bit line setup process, in operation S130, the first latch 211 may be connected to the sensing node SO through the switching circuit 213 and the bit line setup information in the first latch 211 may be applied to the sensing node SO. In operation S140, the page buffer 210 may determine, according to the bit line setup information, whether a memory cell connected to the page buffer 210 is a programming cell. If the memory cell is determined not to be a programming cell in operation S140, in operation S193, the page buffer 210 may apply the inhibiting voltage Vinh to a bit line.

If the memory cell is determined to be a programming cell in operation S140, then in operation S150 the first latch 211 and the sensing node SO are disconnected by the switching circuit 213, and in operation S160 forcing information may be determined by the forcing level Lfc. In operation S170, the second latch 212 may be connected to the sensing node SO by the switching circuit 213 and forcing information in the second latch 212 may be applied to the sensing node SO. In operation S180, the page buffer 210 may determine, according to the forcing information, whether the programming cell is a forcing cell. If the programming cell is determined not to be a forcing cell in operation S180, in operation S191 the page buffer 210 may apply the programming voltage Vpgm to a bit line because a connected memory cell is a programming cell that is not to be forced. If the programming cell is determined to be a programming cell in operation S180, in operation S192 the page buffer 210 may apply the forcing voltage Vfc to a bit line.

Although FIG. 8 shows that the first latch 211 and the sensing node SO are disconnected by the switching circuit 213 in operation S150, the forcing information is determined in operation S160, and the forcing information stored in the second latch 212 by the switching circuit 213 is applied to the sensing node SO in operation S170, this is only an example. It should be understood that an order of operation S150, in which the first latch 211 and the sensing node SO are disconnected from each other, operation S160, in which the forcing information is determined, and operation S170, in which the forcing information is applied to the sensing node SO, may be changed.

Figure 9:
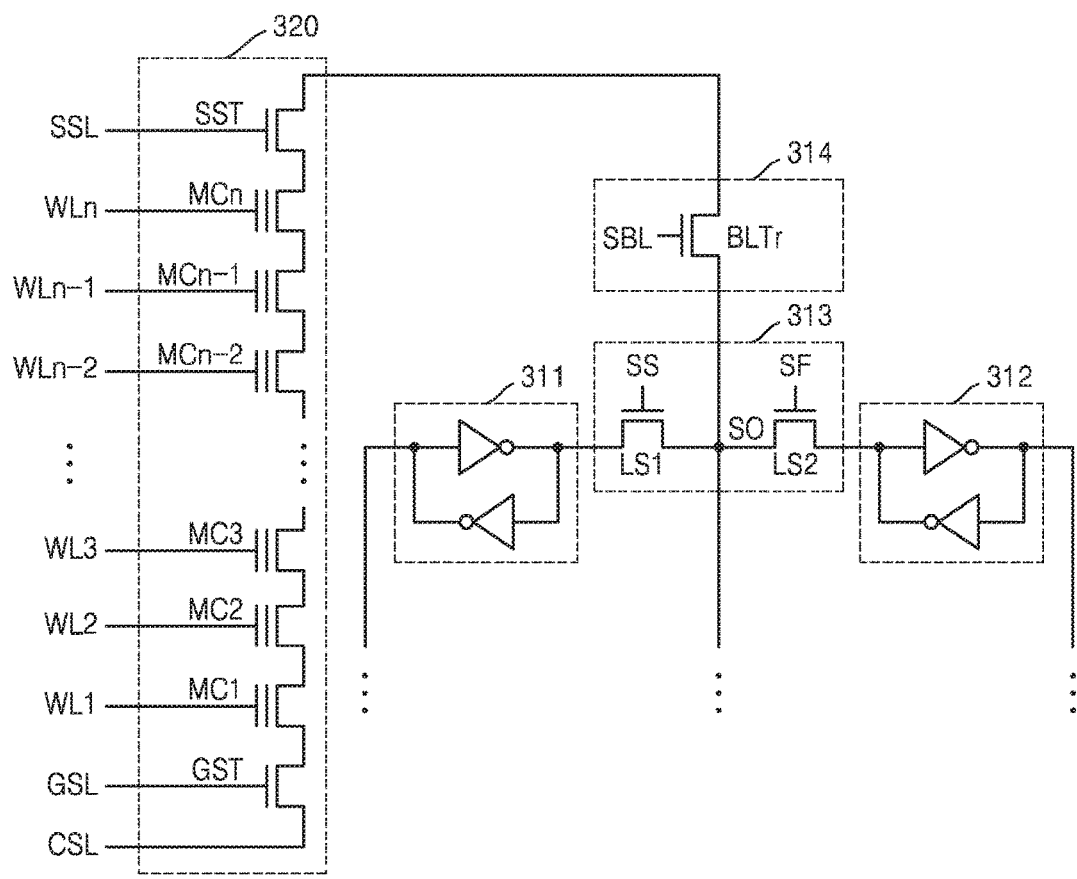
FIG. 9 is a circuit diagram of a nonvolatile memory device according to an example embodiment of the disclosure.

FIG. 9 is a circuit diagram of a nonvolatile memory device according to an example embodiment of the disclosure. In more detail, FIG. 9 is an actual circuit diagram according to an example of FIG. 2. In FIG. 9, like reference numerals to those in FIG. 2 denote like elements, and therefore, repeated descriptions thereof will not be given herein.

Referring to FIG. 9, a page buffer 30 may include a first latch 311, a second latch 312, a switching circuit 313, a bit line selecting circuit 314, and a cell string 320. The first latch 311 may include one or more inverters. In an example embodiment of the disclosure, the first latch 311 may be connected to a separate logic circuit and may receive the forcing power voltage VDD or the ground voltage GND through the logic circuit. The second latch 312 may also include one or more inverters. In an example embodiment of the disclosure, the second latch 312 may be connected to a separate logic circuit and may receive the power voltage VDD or the ground voltage GND through the logic circuit. In another example embodiment of the disclosure, the second latch 312 may receive the power voltage VDD through a logic circuit.

The switching circuit 313 may include a first latch switch LS1 and a second latch switch LS2. Although FIG. 9 shows the first and second latch switches LS1 and LS2 as transistors, the first and second latch switches LS1 and LS2 may include any device capable of performing a switching operation. The first latch switch LS1 may connect the first latch 311 to the sensing node SO in response to a setup signal SS. The second latch switch LS2 may connect the second latch 312 to the sensing node SO in response to a forcing signal SF.

The bit line selecting circuit 314 may include a bit line switch BLTr. The bit line switch BLTr may apply a voltage applied to the sensing node SO to the cell string 320 corresponding to a bit line selecting signal SBL. In an example embodiment of the disclosure, the bit line switch BLTr may adjust a voltage applied to the cell string 320 according to a voltage level of the bit line selecting signal SBL. Detailed descriptions thereof will be described later below with reference to FIG. 10. Although FIG. 9 shows the bit line switch BLTr as a transistor, the bit line switch BLTr may include any device capable of performing a switching operation. Since the cell string 320 is substantially the same as the cell string 220 described above with reference to FIG. 2 and the like, detailed descriptions thereof will not be given herein.

Figure 10:
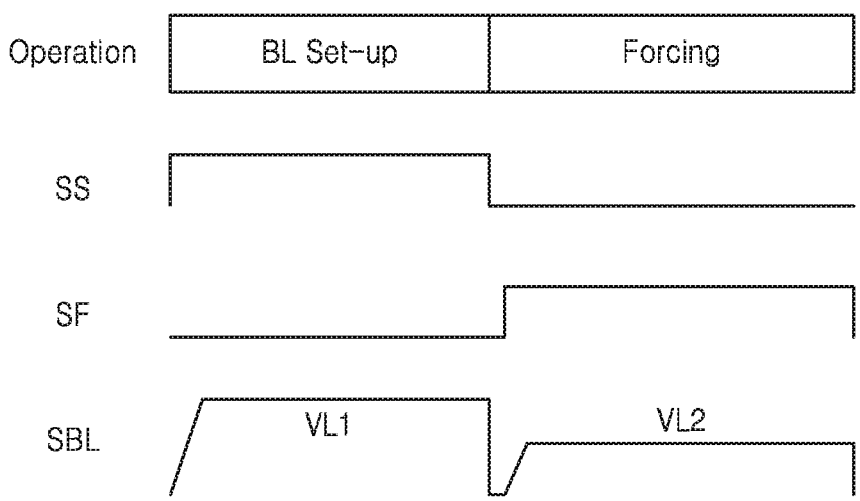
FIG. 10 is a timing diagram of a programming process of a nonvolatile memory device according to an example embodiment of the disclosure.

FIG. 10 is a timing diagram of a programming process of a nonvolatile memory device according to an example embodiment of the disclosure. In FIG. 10, like reference numerals to those in FIG. 9 denote like elements, and therefore, repeated descriptions thereof will not be given herein.

Referring to FIGS. 9 and 10, during a bit line setup operation (BL Set-up), the setup signal SS applied to a gate of the first latch switch LS1 may transit to logic high and the forcing signal SF applied to a gate of the second latch switch LS2 may be maintained at logic low. Thus, the first latch switch LS1 may be changed to an ON state, and the first latch 311 and the sensing node SO may be electrically connected to each other. Furthermore, bit line setup information stored in the first latch 311 may be applied to the sensing node SO. The bit line selecting signal SBL applied to a gate of the bit line switch BLTr may transit to a first voltage level VL1. Accordingly, a bit line switch BLTr may be changed to an ON state, and the programming voltage Vpgm may be applied to the cell string 320 according to the bit line setup information applied to the sensing node SO.

During a forcing operation (Forcing), the first latch switch LS1 and the bit line switch BLTr may be changed to an OFF state as the setup signal SS and the bit line selecting signal SBL transit to logic low, and the second latch switch LS2 may be changed to an ON state as the forcing signal SF transits to logic high. Accordingly, the second latch 312 and the sensing node SO may be electrically connected to each other, and the forcing information stored in the second latch 312 may be applied to the sensing node SO. The bit line selecting signal SBL may transit again to a second voltage level VL2. Accordingly, the bit line switch BLTr may be changed to an ON state, and the forcing voltage Vfc may be applied to the cell string 320 according to the forcing information applied to the sensing node SO. Since the second voltage level VL2 is lower than the first voltage level VL1, the forcing voltage Vfc and the inhibiting voltage Vinh applied to the cell string 320 may have different voltage levels.

Figure 11:
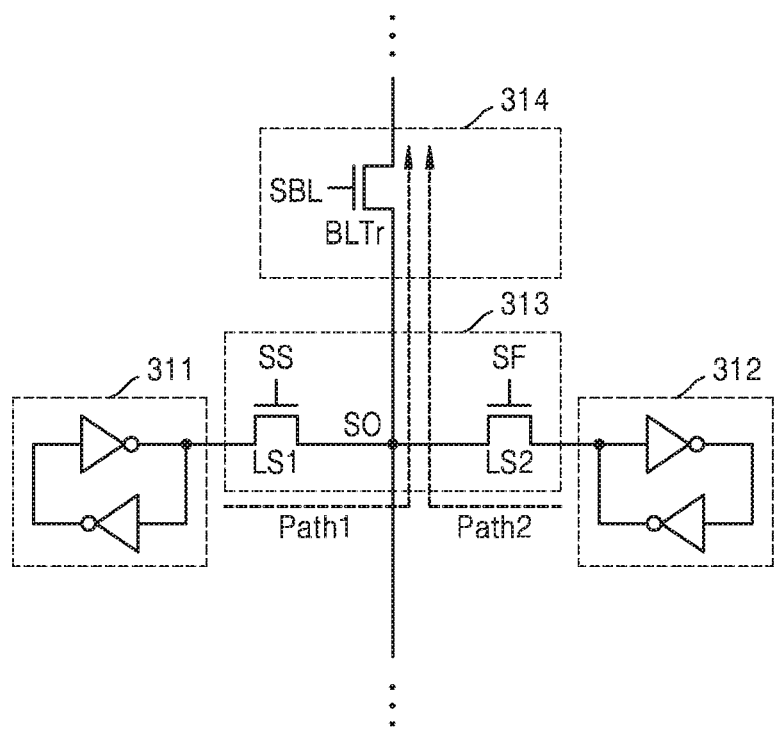
FIG. 11 is a circuit diagram of a page buffer according to an example embodiment of the disclosure.

FIG. 11 is a circuit diagram of a page buffer according to an example embodiment of the disclosure. In FIG. 11, like reference numerals to those in FIG. 9 denote like elements, and therefore, repeated descriptions thereof will not be given herein.

Referring to FIGS. 9 and 11, the page buffer 30 may include a first path Path1 connected to the cell string 320 via the first latch 311 and the first latch switch LS1 and a second path Path2 connected to the cell string 320 via the second latch 312 and the second latch switch LS2. The first and second paths Path1 and Path2 may be controlled by the switching circuit 313. According to an example embodiment of the disclosure, the first path Path1 may be activated as the first latch switch LS1 transits to an ON state during the bit line setup operation, and when the bit line setup operation is completed, the first path Path1 may be inactivated as the first latch switch LS1 transits to an OFF state. Next, the second path Path2 may be activated as the second latch switch LS2 transits to an ON state during the forcing operation.

The bit line setup information stored in the first latch 311 may be applied to the sensing node SO according to the first path Path1 and the page buffer 30 may perform a bit line setup operation based on the bit line setup information. The forcing information stored in the second latch 312 may be applied to the sensing node SO according to the second path Path2 and the page buffer 30 may perform a forcing operation based on the forcing information.

Figure 12:
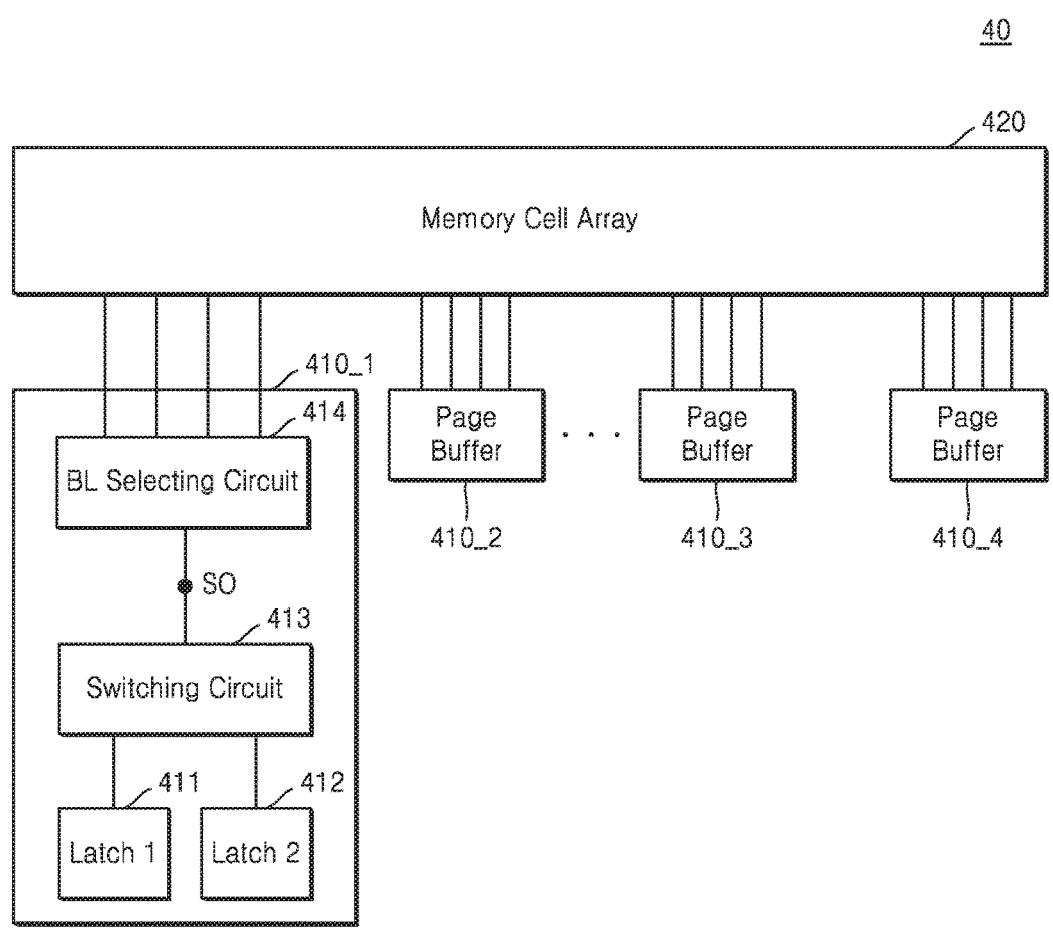
FIG. 12 is a block diagram of a nonvolatile memory device according to an example embodiment of the disclosure.

FIG. 12 is a block diagram of a nonvolatile memory device according to an example embodiment of the disclosure. In FIG. 12, like reference numerals to those in FIG. 2 denote like elements, and therefore, repeated descriptions thereof will not be given herein.

Referring to FIGS. 2 and 12, a nonvolatile memory device 40 may include a plurality of page buffers 410_1, 410_2, 410_3, and 410_4, and a memory cell array 420. Each of the plurality of page buffers 410_1, 410_2, 410_3, and 410_4 A may include a first latch 411, a second latch 412, a switching circuit 413, and a bit line selecting circuit 414. The page buffers 410_2, 410_3, and 410_4, the internal configuration of which is not shown, may also have the same configuration as the page buffer 410_1, the internal configurations of which is shown. The first and second latches 411 and 412 and the switching circuit 413 may be substantially the same as the first and second latches 211 and 212, and the switching circuit 213 of FIG. 2, respectively. Therefore, detailed descriptions thereof will not be given herein.

Each of the plurality of page buffers 410_1, 410_2, 410_3, and 410_4 may have a shield bit line structure. Each of the plurality of page buffers 410_1, 410_2, 410_3, and 410_4 may be connected to a plurality of bit lines at the same time. Although FIG. 12 shows that each of the plurality of page buffers 410_1, 410_2, 410_3, and 410_4 is connected to four bit lines, this is merely an example. Each of the plurality of page buffers 410_1, 410_2, 410_3, and 410_4 may be connected to two or more bit lines. Only one page buffer 410_1 will be described below, but the disclosure may also be applied to all the other page buffers 410_2, 410_3, and 410_4.

The bit line selecting circuit 414 may be connected to a plurality of bit lines. The plurality of bit lines may include a setup bit line to be programmed and a remaining shield bit line not to be programmed. The bit line selecting circuit 414 may set at least one of the plurality of bit lines to be a setup bit line. When a programming operation for the setup bit line is completed, the bit line selecting circuit 414 may sequentially set the next bit line to be the setup bit line and perform the programming operation. When the programming operation for the setup bit line is performed, an inhibiting voltage may be applied to the shield bit line so that an inhibited state may be maintained. As the shield bit line enters the inhibited state, an influence of coupling to the setup bit line from the other page buffers 410_2, 410_3, and 410_4 or neighboring bit lines connected to the other page buffers 410_2, 410_3, and 410_4 may be prevented. According to an example embodiment of the disclosure, the influence of coupling may be prevented by the shield bit line even if the setup bit line enters a floating state during the forcing operation. According to another example embodiment of the disclosure, the page buffer 410_1 may adjust a ratio of the shield bit line to the plurality of bit lines according to a degree of the coupling. Detailed descriptions thereof will be described later below with reference to FIG. 16.

Figure 13:
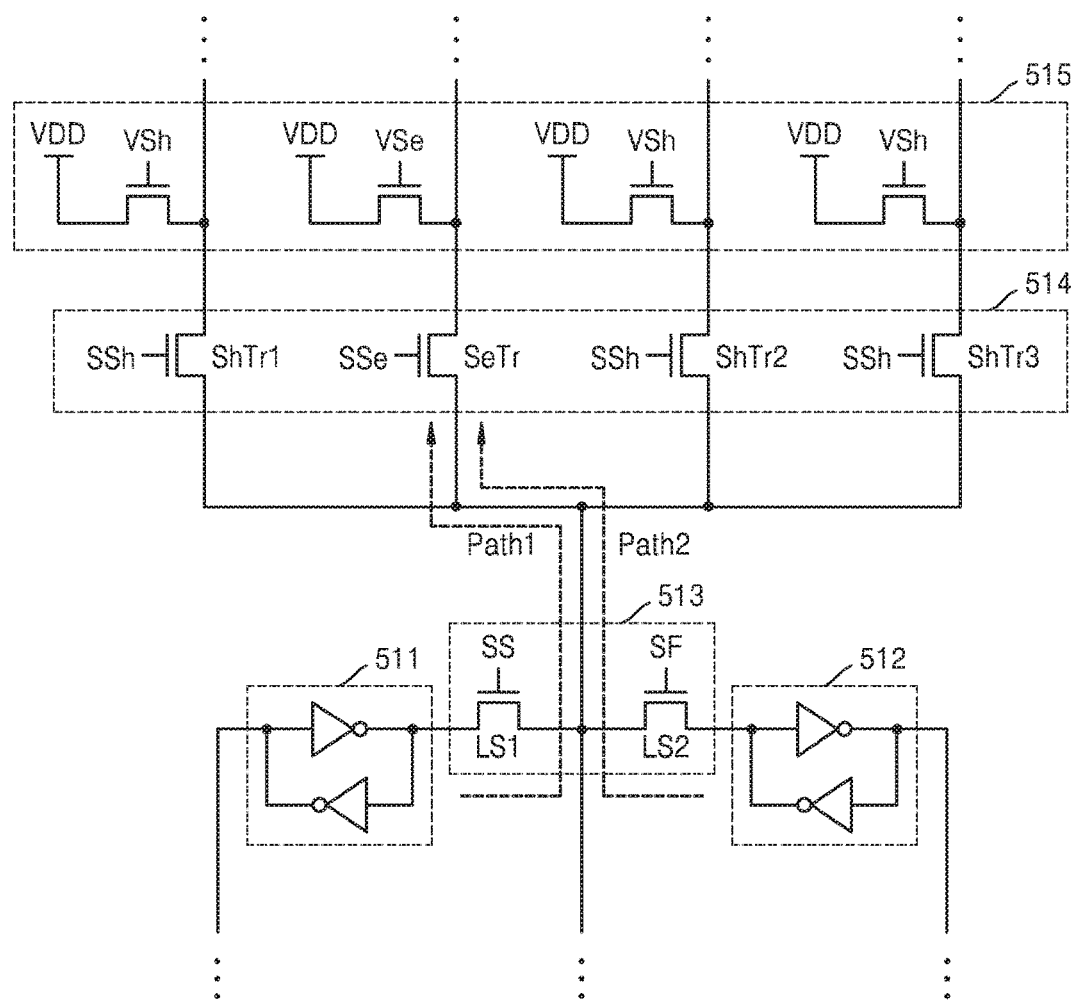
FIG. 13 is a circuit diagram of a nonvolatile memory device according to an example embodiment of the disclosure.

FIG. 13 is a circuit diagram of a nonvolatile memory device according to an example embodiment of the disclosure. In FIG. 13, like reference numerals to those in FIGS. 9 and 12 denote like elements, and therefore, repeated descriptions thereof will not be given herein.

Referring to FIGS. 9, 12 and 13, a page buffer 50 may include a first latch 511, a second latch 512, a switching circuit 513, a bit line selecting circuit 514, and a bias circuit 515. The first and second latches 511 and 512 and the switching circuit 513 may be substantially the same as the first and second latches 311 and 312 and the switching circuit 313 of FIG. 9, respectively. Therefore, detailed descriptions thereof will not be given herein.

The bit line selecting circuit 514 may be connected to a plurality of bit lines. The plurality of bit lines may include a setup bit line to be programmed and a remaining shield bit line not to be programmed Although FIG. 13 shows that the bit line selecting circuit 514 is connected to four bit lines, this is merely an example. The bit line selecting circuit 514 may be connected to two or more bit lines. Also, although not shown in FIG. 13, each bit line may be connected to a cell string.

The bit line selecting circuit 514 may include switches SeTr, ShTr1, ShTr2, and ShTr3 that are connected to bit lines, respectively. In more detail, the bit line selecting circuit 514 may include the setup switch SeTr and the shield switches ShTr1, ShTr2, and ShTr3. Although FIG. 13 shows the switches SeTr, ShTr1, ShTr2, and ShTr3 as transistors, the switches SeTr, ShTr1, ShTr2, and ShTr3 may include any device capable of performing a switching operation.

Each of the switches SeTr, ShTr1, ShTr2, and ShTr3 may be connected to a bit line to control a connection between the sensing node SO and the bit line. The setup switch SeTr may be connected to a setup bit line to be programmed and the shield switches ShTr1, ShTr2, and ShTr3 may be connected to a shield bit line to prevent coupling to the setup bit line. The setup switch SeTr may control voltage application to the setup bit line, in response to a setup selecting signal SSe, so as to perform the bit line setup operation and the forcing operation. Detailed descriptions of the setup selecting signal SSe and the setup switch SeTr will be described later below with reference to FIG. 14. The shield switches ShTr1, ShTr2, and ShTr3 maintain an OFF state, corresponding to a shield selecting signal SSh, during the bit line setup operation and forcing operation for the setup bit line so that a voltage of the sensing node SO may not be applied to the shield bit line.

The bias circuit 515 may apply a certain voltage to the bit line according to the control of bias signals VSe and VSh. In more detail, the power voltage VDD may be applied to the setup bit line by the setup bias signal VSe, and the power voltage VDD may be applied to the shield bit line by the shield bias signal VSh. According to an example embodiment of the disclosure, while the bit line setup operation for the setup bit line is performed, the shield bit line may be biased to the power voltage VDD to maintain an inhibited state. Coupling of the setup bit line may be prevented as the shield bit line is maintained in the inhibited state. FIG. 13 shows that the bias circuit 515 is connected to only the power voltage VDD. However, in another example embodiment of the present disclosure, the bias circuit 515 may be connected to the ground voltage GND in addition to the power voltage VDD.

The page buffer 50 may include the first path Path1 connected to the setup bit line via the first latch 511 and the first latch switch LS1 and the second path Path2 connected to the setup bit line via the second latch 312 and the second latch switch LS2. The first and second paths Path1 and Path2 may be controlled by the switching circuit 513. According to an example embodiment of the disclosure, the first path Path1 may be activated as the first latch switch LS1 transits to an ON state during the bit line setup operation, and when the bit line setup operation is completed, the first path Path1 may be inactivated as the first latch switch LS1 transits to an OFF state. Next, the second path Path2 may be activated as the second latch switch LS2 transits to an ON state during the forcing operation.

Figure 14:
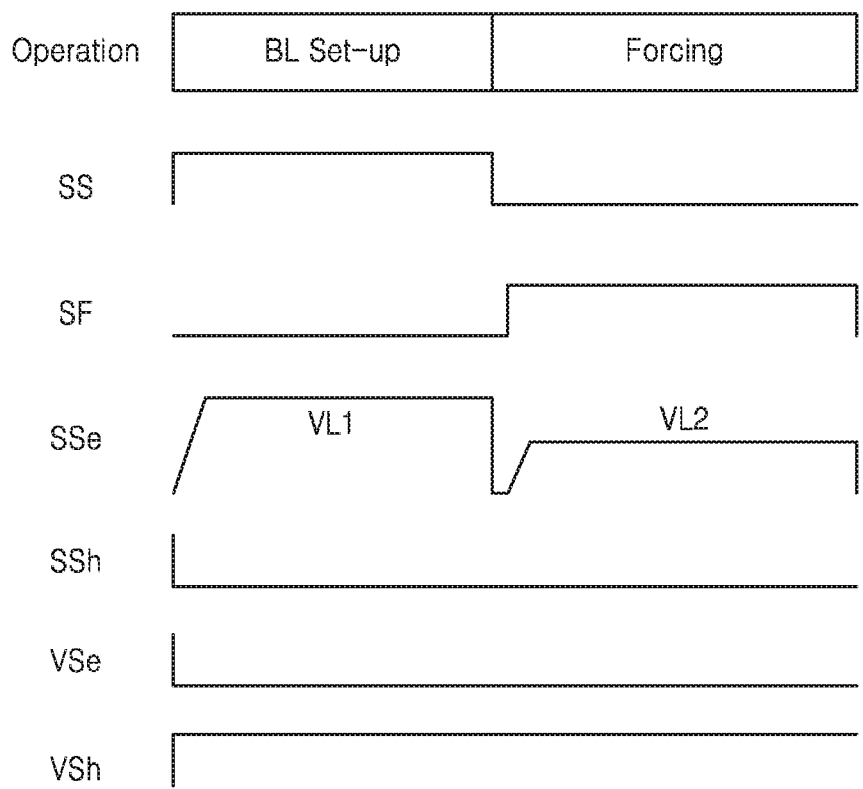
FIG. 14 is a timing diagram of a programming process of a nonvolatile memory device according to an example embodiment of the disclosure.

FIG. 14 is a timing diagram of a programming process of a nonvolatile memory device according to an example embodiment of the disclosure. In FIG. 14, like reference numerals to those in FIG. 13 denote like elements, and therefore, repeated descriptions thereof will not be given herein.

Referring to FIGS. 13 and 14, during a bit line setup operation (BL Set-up), the setup signal SS applied to a gate of the first latch switch LS1 may transit to logic high and the forcing signal SF applied to a gate of the second latch switch LS2 may be maintained at logic low. Thus, the first latch switch LS1 may be changed to an ON state, and the first latch 511 and the sensing node SO may be electrically connected to each other. Furthermore, bit line setup information stored in the first latch 511 may be applied to the sensing node SO.

The setup selecting signal SSe applied to a gate of the setup switch SeTr may transit to the first voltage level VL1. Accordingly, the setup switch SeTr may be changed to an ON state, and the programming voltage Vpgm may be applied to a cell string connected to the setup bit line according to the bit line setup information applied to the sensing node SO. In addition, the setup bias signal VSe may be maintained at logic low to prevent a bias voltage from being applied to the setup bit line.

As the shield selecting signal SSh applied to a gate of a shield switch ShTr is maintained at logic low, the shield switches ShTr1, ShTr2 and ShTr3 remain OFF, and the supply voltage VDD may be applied to the shield bit line as the shield bias signal VSh is maintained at logic high. By this process, the shield bit line may maintain an inhibited state.

During a forcing operation (Forcing), the first latch switch LS1 and the setup switch SeTr may be changed to an OFF state as the setup signal SS and the setup selecting signal SSe transit to logic low, and the second latch switch LS2 may be changed to an ON state as the forcing signal SF transits to logic high. Accordingly, the second latch 512 and the sensing node SO may be electrically connected to each other, and the forcing information stored in the second latch 512 may be applied to the sensing node SO. The setup selecting signal SSe may transit again to the second voltage level VL2. Accordingly, the setup switch SeTr may be changed to an ON state, and the forcing voltage Vfc may be applied to the cell string connected to the setup bit line according to the forcing information applied to the sensing node SO. Since the second voltage level VL2 is lower than the first voltage level VL1, the forcing voltage Vfc applied to the cell string connected to the setup bit line may have a voltage level different from that of the programming voltage Vpgm.

During the forcing operation, the shield selecting signal SSh may be maintained at logic low to prevent the forcing voltage Vfc from being applied to the shield bit line. In addition, the setup bias signal VSe may also be maintained at logic low to prevent the setup bit line from being biased to the power voltage VDD. The shield bias signal VSh is maintained at logic high so that the shield bit line may maintain an inhibited state. In an example embodiment of the disclosure, different from FIG. 14, the shield bias signal VSh may transit from a forcing operation to logic low. In the forcing operation, the shield bit line does not have to be in an inhibited state. Accordingly, even if the shield bias signal VSh transits to logic low, the setup bit line may not be affected by coupling.

Figure 15:
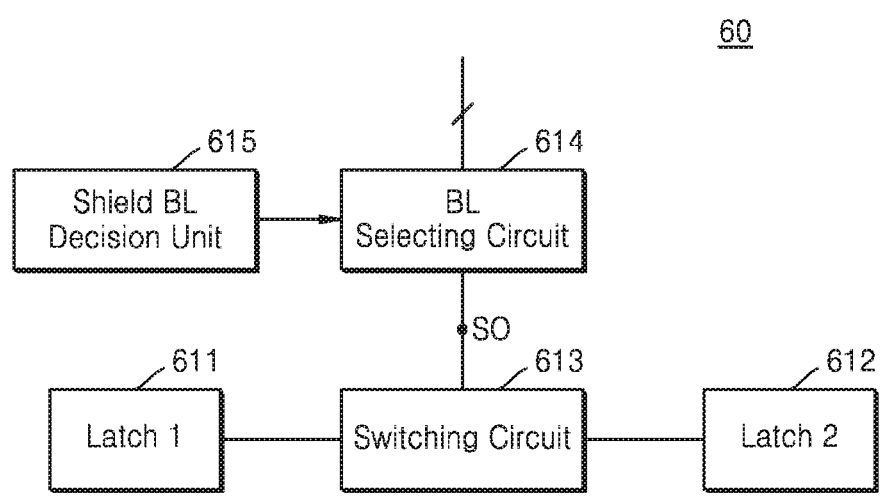
FIG. 15 is a block diagram of a page buffer according to an example embodiment of the disclosure.

FIG. 15 is a block diagram of a page buffer according to an example embodiment of the disclosure. In FIG. 15, like reference numerals to those in FIG. 13 denote like elements, and therefore, repeated descriptions thereof will not be given herein.

Referring to FIGS. 13 and 15, a page buffer 60 may include a first latch 611, a second latch 612, a switching circuit 613, a bit line selecting circuit 614, and a shield bit line decision unit 615. The first and second latches 612 and 611, the switching circuit 613, and the bit line selection circuit 614 may be substantially the same as the first and second latches 311 and 312, the switching circuit 313, and the bit line selecting circuit 314 of FIG. 9, respectively.

The shield bit line decision unit 615 may control the bit line selecting circuit 614 to adjust a ratio of shield bit lines to all bit lines. If a degree of coupling is high, a relatively large number of shield bit lines may be required to prevent coupling to a setup bit line, and if a degree of coupling is low, a relatively small number of shield bit lines may be required. The shield bit line decision unit 615 may adjust a ratio of the shield selecting signal SSe and the shield selecting signal SSh applied to the bit line selecting circuit 514 according to a degree of coupling to adjust the ratio of the shield bit line. In more detail, the shield bit line decision unit 615 may increase the ratio of the shield bit line when coupling occurs to a large extent, and may decrease the shield bit line ratio when coupling occurs to a small extent. In an example embodiment of the disclosure, the shield bit line decision unit 615 may receive information about a degree of coupling and adjust a ratio of the shield bit line accordingly.

Figure 16:
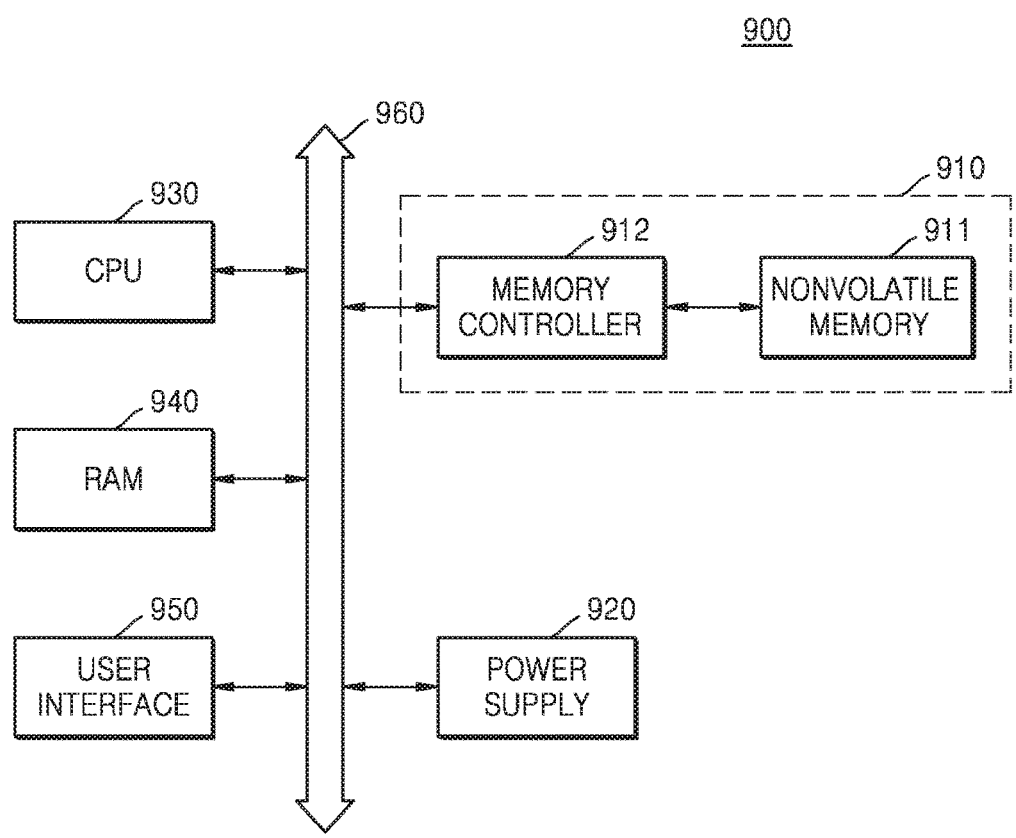
FIG. 16 is a block diagram of a computing system device including a nonvolatile memory device according to an example embodiment of the disclosure.

FIG. 16 is a block diagram of a computing system device including a nonvolatile memory device according to an example embodiment of the disclosure.

Referring to FIG. 16, a computing system device 900 may include a microprocessor 930 electrically connected to a bus 960, a user interface 950, and a nonvolatile memory system 910 having a memory controller 912 and a nonvolatile memory device 911. The nonvolatile memory device 911 may store data processed/to be processed by the microprocessor 930 via the memory controller 912. In addition, the nonvolatile memory device 911 may also include the nonvolatile memory device described in FIGS. 1 through 15. The computing system device 900 may further include a RAM 940 and a power supply 920.

If the computing system device 900 is a mobile device, a battery for supplying an operating voltage of a computing system and a modem such as a baseband chipset may be additionally provided. Furthermore, it will be apparent to those of ordinary skilled in the art that the computing system device 900 may be further provided with an application chipset, a camera image processor (CIS), a mobile dynamic random access memory (DRAM), and the like, and thus detailed descriptions thereof will not be given herein.

Preferably, the memory controller 912 and the nonvolatile memory device 911 may include, e.g., a solid-state drive (SSD) using a nonvolatile memory for storing data.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to example embodiments thereof, it will be understood that various changes in form and details may be made therein without departing from the spirit and scope of the following claims.

What is claimed is:

1. A nonvolatile memory device comprising:
a cell string including a plurality of memory cells connected to a bit line; and
a page buffer connected to the bit line via a sensing node and connected to the cell string via the bit line, wherein:
the page buffer includes a first latch that stores bit line setup information and a second latch that stores forcing information,
the first latch is configured to output the bit line setup information to the sensing node, by being connected to the sensing node, and the second latch is configured to output the forcing information to the sensing node independently of the first latch by being connected to the sensing node, and
the page buffer further comprises a first transistor, which is placed between the first latch and the sensing node and coupled with the first latch, and a second transistor, which is placed between the second latch and the sensing node and coupled with the second latch.

2. The nonvolatile memory device of claim 1, wherein the page buffer is configured to apply:
a programming voltage to memory cells to be programmed, which are not memory cells to be forced, based on the bit line setup information and the forcing information,
an inhibiting voltage to memory cells to be inhibited, and
a forcing voltage having a voltage level higher than a voltage level of the programming voltage and lower than a voltage level of the inhibiting voltage to the memory cells to be forced.

3. The nonvolatile memory device of claim 1, wherein:
the page buffer is configured to perform a bit line setup operation and a forcing operation during a programming operation for the plurality of memory cells,
the first transistor is configured to connect the first latch to the sensing node during the bit line setup operation, and
the second transistor is configured to connect a voltage source to the sensing node during the forcing operation.

4. The nonvolatile memory device of claim 3, wherein:
the page buffer is configured to perform the forcing operation after completing the bit line setup operation,
the first transistor is configured to disconnect the first latch from the sensing node when the bit line setup operation is completed, and
the second transistor is configured to connect the voltage source to the sensing node after the first latch and the sensing node are disconnected.

5. The nonvolatile memory device of claim 1, wherein the page buffer is configured to have an all bit line structure connected to a single bit line to which a bit line setup operation is performed.

6. The nonvolatile memory device of claim 5, wherein the bit line connected to memory cells to be programmed, but not memory cells to be forced, is floated when a forcing operation is performed.

7. The nonvolatile memory device of claim 1, wherein:
the page buffer is configured to perform a programming operation including a bit line setup operation and a forcing operation for the memory cells,
the first latch is configured to output the bit line setup information to the sensing node when performing the bit line setup operation, and
the second latch is configured to output the forcing information to the sensing node when performing the forcing operation.

8. A nonvolatile memory device comprises:
a plurality of cell strings including a plurality of memory cells; and
a page buffer comprising a first path configured to output bit line setup information to a selected memory cell, among the memory cells, and a second path configured to output forcing information to the selected memory cell, wherein the first and second paths are independently activated, wherein:
the page buffer further comprises a first switch, which is placed on the first path, configured to activate the first path and a second switch, which is placed on the second path, configured to activate the second path.

9. The nonvolatile memory device of claim 8, wherein the page buffer is configured to have an all bit line structure connected to a cell string via a single bit line.

10. The nonvolatile memory device of claim 8, wherein:
the bit line setup information is configured to distinguish between memory cells to be programmed and memory cells to be inhibited based on a verifying level, and
the forcing information is configured to distinguish memory cells to be forced based on a forcing level.

11. The nonvolatile memory device of claim 8, wherein:
a first cell string, among the plurality of cell strings, includes first memory cells, among the plurality of memory cells, connected via a bit line,
the page buffer is connected to the bit line via a sensing node,
the first path includes a first latch that outputs the bit line setup information to the selected memory cell through the sensing node,
the second path includes a second latch that outputs the forcing information to the selected memory cell through the sensing node, and
the page buffer further comprises a first switch, which is placed between the first latch and the sensing node on the first path, and a second switch, which is placed between the second latch and the sensing node on the second path.

12. The nonvolatile memory device of claim 11, wherein the page buffer applies:
a programming voltage to second memory cells to be programmed based on the bit line setup information and the forcing information, wherein the second memory cells are included within third memory cells, among the plurality of memory cells, that are not to be forced,
an inhibiting voltage to fourth memory cells, among the plurality of memory cells, to be inhibited, and
a forcing voltage having a voltage level higher than a voltage level of the programming voltage and lower than a voltage level of the inhibiting voltage to fifth memory cells, among the plurality of memory cells, to be forced.

13. The nonvolatile memory device of claim 11, wherein:
the page buffer performs a bit line setup operation and a forcing operation during a programming operation for the plurality of memory cells,
the first switch connects the first latch to the sensing node during the bit line setup operation, and
the second switch connects a voltage source to the sensing node during the forcing operation.

14. The nonvolatile memory device of claim 13, wherein:
the page buffer performs the forcing operation after completing the bit line setup operation,
the first switch disconnects the first latch from the sensing node when the bit line setup operation is completed, and
the second switch connects the voltage source to the sensing node after the first latch and the sensing node are disconnected.

15. A nonvolatile memory device comprising:
a cell string including a plurality of memory cells connected to a bit line; and
a page buffer connected to the bit line via a sensing node and connected to the cell string via the bit line, wherein:
the page buffer includes a first latch that stores bit line setup information and a second latch that stores forcing information,
the first latch is configured to output the bit line setup information to the sensing node, by being coupled to the sensing node, and the second latch is configured to output the forcing information to the sensing node independently of the first latch by being coupled to the sensing node, and
the page buffer further comprises a first transistor and a second transistor, wherein
the first latch and the sensing node are coupled through the first transistor, and the second latch and the second transistor are coupled through the second transistor.

16. The nonvolatile memory device of claim 15, wherein the page buffer is configured to apply:
a programming voltage to memory cells to be programmed, which are not memory cells to be forced, based on the bit line setup information and the forcing information,
an inhibiting voltage to memory cells to be inhibited, and
a forcing voltage having a voltage level higher than a voltage level of the programming voltage and lower than a voltage level of the inhibiting voltage to the memory cells to be forced.

17. The nonvolatile memory device of claim 15, wherein:
the page buffer is configured to perform a bit line setup operation and a forcing operation during a programming operation for the plurality of memory cells,
the first latch is configured to be coupled to the sensing node during the bit line setup operation through the first transistor, and
the second latch is configured to be coupled to the sensing node during the forcing operation through the second transistor.

18. The nonvolatile memory device of claim 17, wherein:
the page buffer is configured to perform the forcing operation after completing the bit line setup operation,
the first latch is configured to be uncoupled to the sensing node when the bit line setup operation is completed, and
the second latch is configured to be coupled to the sensing node after the first latch is uncoupled to the sensing node.

19. The nonvolatile memory device of claim 15, wherein the page buffer is configured to have an all bit line structure connected to a single bit line to which a bit line setup operation is performed.

20. The nonvolatile memory device of claim 19, wherein the bit line connected to memory cells to be programmed, but not memory cells to be forced, is floated when a forcing operation is performed.

* * * * *